(12) United States Patent
Choi

(10) Patent No.: US 7,813,424 B2
(45) Date of Patent: Oct. 12, 2010

(54) METHOD AND APPARATUS FOR COMPENSATING FOR MISMATCH OCCURRING IN RADIO FREQUENCY QUADRATURE TRANSCEIVER USING DIRECT-CONVERSION SCHEME

(75) Inventor: Pil-soon Choi, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 774 days.

(21) Appl. No.: 11/790,118

(22) Filed: Apr. 24, 2007

(65) Prior Publication Data

US 2008/0151977 A1     Jun. 26, 2008

(30) Foreign Application Priority Data

Oct. 27, 2006     (KR) .................. 10-2006-0105040

(51) Int. Cl.
*H03H 7/30* (2006.01)
*H03H 7/40* (2006.01)
*H03K 5/159* (2006.01)

(52) U.S. Cl. .................. 375/235; 375/219; 375/222; 375/261; 375/298; 332/103

(58) Field of Classification Search ............... 375/235, 375/219, 222, 261, 340, 298; 332/103
See application file for complete search history.

(56) References Cited

U.S. PATENT DOCUMENTS 5,771,263 A * 6/1998 Kanazawa et al. .......... 375/261
7,412,006 B2 * 8/2008 Talwalkar et al. .......... 375/284

* cited by examiner

*Primary Examiner*—Phuong Phu
(74) *Attorney, Agent, or Firm*—Sughrue Mion, PLLC

(57) ABSTRACT

A method and apparatus for compensating for a mismatch in a radio frequency (RF) quadrature transceiver using a direct-conversion scheme is provided. The method includes setting an amplification gain for a baseband quadrature signal to be larger than an amplification gain for a baseband in-phase signal in a reception module; receiving only a baseband in-phase signal in a transmission module; and compensating for a phase mismatch on a basis of a signal output from a quadrature output port. The apparatus includes a phase mismatch compensator which sets an amplification gain for a baseband quadrature signal to be larger than an amplification gain for a baseband in-phase signal in a reception module, inputs only a baseband in-phase signal to a transmission module, and compensates for a phase mismatch on a basis of a signal output from a quadrature output port.

9 Claims, 10 Drawing Sheets

FIG. 8A    FIG. 8B    FIG. 8C
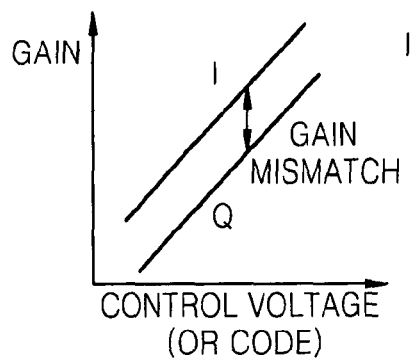
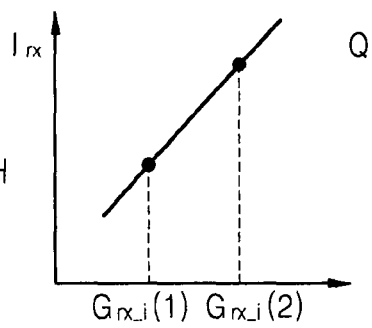
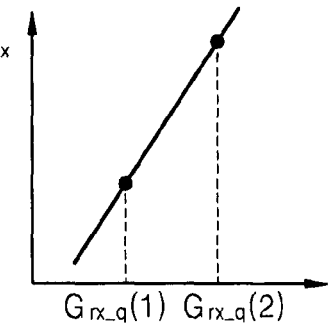
FIG. 9A
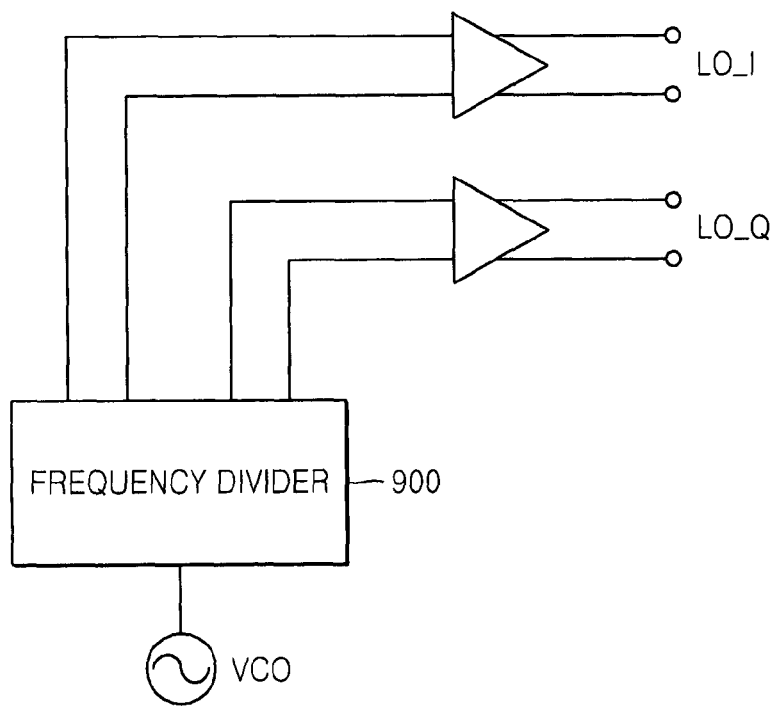

METHOD AND APPARATUS FOR COMPENSATING FOR MISMATCH OCCURRING IN RADIO FREQUENCY QUADRATURE TRANSCEIVER USING DIRECT-CONVERSION SCHEME

CROSS-REFERENCE TO RELATED PATENT APPLICATION

This application claims priority from Korean Patent Application No. 10-2006-0105040, filed on Oct. 27, 2006, in the Korean Intellectual Property Office, the disclosure of which is incorporated herein in its entirety by reference.

BACKGROUND OF THE INVENTION

1. Field of the Invention

Methods and apparatuses consistent with the present invention relate to a radio frequency (RF) quadrature transceiver, and more particularly, to compensating for a mismatch occurring in an RF quadrature transceiver based on a direct-conversion scheme.

2. Description of the Related Art

In digital communications using a method of modulating or demodulating a phase or a frequency, a direction conversion method not using an intermediate frequency band uses an in-phase carrier signal and a quadrature-phase carrier signal that have a phase difference of 90 degrees. However, when a phase difference between the two signals is not exactly 90 degrees, or a mismatch between the overall gains obtained by the paths of the two signals is generated, signal distortion can occur. Accordingly, research into a method of efficiently and accurately compensating for a phase mismatch and a gain mismatch has been conducted.

FIGS. 1A and 1B are schematic diagrams illustrating structures of related art radio frequency (RF) quadrature transceivers. FIG. 1A illustrates a related art radio frequency integrated circuit (RFIC) manufactured by Athena Semiconductors, Inc., in which a feedback loop is established between a transmission module and a reception module, and thus a phase mismatch and a gain mismatch are compensated for by using a predetermined algorithm after a signal transmitted by the transmission module is directly received by the reception module. However, the RFIC of FIG. 1A must include a special envelope detector in order to achieve this mismatch compensation, and the reception module must perform a complicated digital signal processing operation using a signal received via the envelope detector.

FIG. 1B illustrates a related art RFIC manufactured by Atheros Communications Inc. This RFIC employs a 2-stage conversion scheme, such that signals having a phase difference of 90 degrees are not used in an RF band and a quadrature signal is generated in a frequency band (e.g., ¼ of a carrier frequency band) lower than the RF band. Therefore, the 2-stage conversion scheme generates fewer phase errors and fewer gain errors than when employing the direct conversion scheme. However, the compensation method of FIG. 1B also cannot completely prevent generations of a phase mismatch and a gain mismatch. Rather, the use of an intermediate frequency causes an image frequency problem. Moreover, the 2-stage conversion scheme requires more mixers and more LO2 generation circuits than the other schemes. Accordingly, the RFIC employing the 2-stage conversion scheme consumes much power and has a large size.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

Exemplary embodiments of the present invention provide an apparatus and method of compensating for a phase mismatch and a gain mismatch, by which a radio frequency (RF) quadrature transceiver using a general direct-conversion scheme does not include an additional circuit and does not need to perform a complicated digital signal processing operation.

According to an aspect of the present invention, there is provided a signal processing method performed in a radio frequency quadrature transceiver, the method comprising setting an amplification gain for a baseband quadrature signal to be larger than an amplification gain for a baseband in-phase signal in a reception module and receiving only a baseband in-phase signal in a transmission module; and compensating for a phase mismatch on a basis of a signal output from a quadrature output port.

The signal processing method may further comprise setting amplification gain control signals for baseband signals of one of the reception module and the transmission module to be the same, and setting amplification gain control signals for baseband signals of the other module to be a first value; inputting identical signals to an in-phase input port and a quadrature input port of the transmission module and measuring amplitudes of baseband signals output from the reception module; setting the amplification gain control signals for the baseband signals of the other module to be a second value, re-inputting the identical signals to the in-phase input port and the quadrature input port of the transmission module, and measuring the amplitudes of baseband signals output from the reception module; calculating a gain mismatch between an in-phase path and a quadrature path of the one module on the basis of the amplitudes measured for the first value and the second value; and compensating for the gain mismatch of the one module on a basis of a result of the calculation.

The signal processing method may further comprise inputting identical signals to the in-phase input port and the quadrature input port of the transmission module, comparing the amplitudes of baseband signals output from the reception module, and compensating for a gain mismatch of the other module according to a result of the comparison.

Carrier signals used in the transmission module and the reception module may be generated by a frequency divider comprised of two cross-coupled latches. Compensating for the phase mismatch may comprise controlling a phase difference between the two carrier signals by independently controlling main currents of the latches of the frequency divider.

According to another aspect of the present invention, there is provided a radio frequency quadrature transceiver comprising a phase mismatch compensator which sets an amplification gain for a baseband quadrature signal to be larger than an amplification gain for a baseband in-phase signal in a reception module, inputs only a baseband in-phase signal to a transmission module, and compensates for a phase mismatch on the basis of a signal output from a quadrature output port.

BRIEF DESCRIPTION OF THE DRAWINGS

The above and other aspects of the present invention will become more apparent by describing in detail exemplary embodiments thereof with reference to the attached drawings in which:

FIGS. 8A through 8C are graphs illustrating an algorithm for estimating the value of a gain mismatch, according to an exemplary embodiment of the present invention;

FIGS. 9A through 9C are schematic diagrams of an apparatus for compensating for a phase mismatch, according to an exemplary embodiment of the present invention.

DETAILED DESCRIPTION OF EXEMPLARY EMBODIMENTS OF THE PRESENT INVENTION

Exemplary embodiments of the present invention will now be described more fully with reference to the accompanying drawings, in which exemplary embodiments of the invention are shown.

Figure 1A:
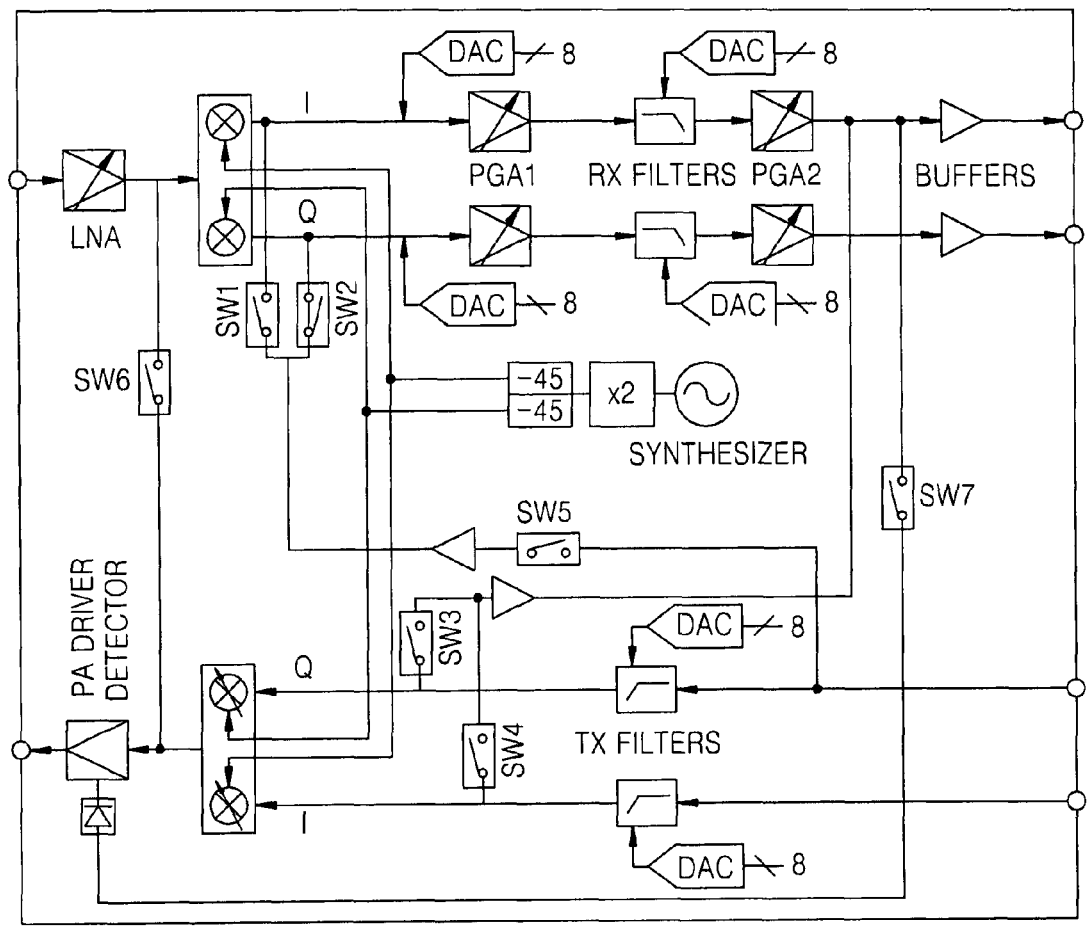
FIGS. 1A and 1B are schematic diagrams illustrating structures of related art radio frequency (RF) quadrature transceivers.
Figure 1B:
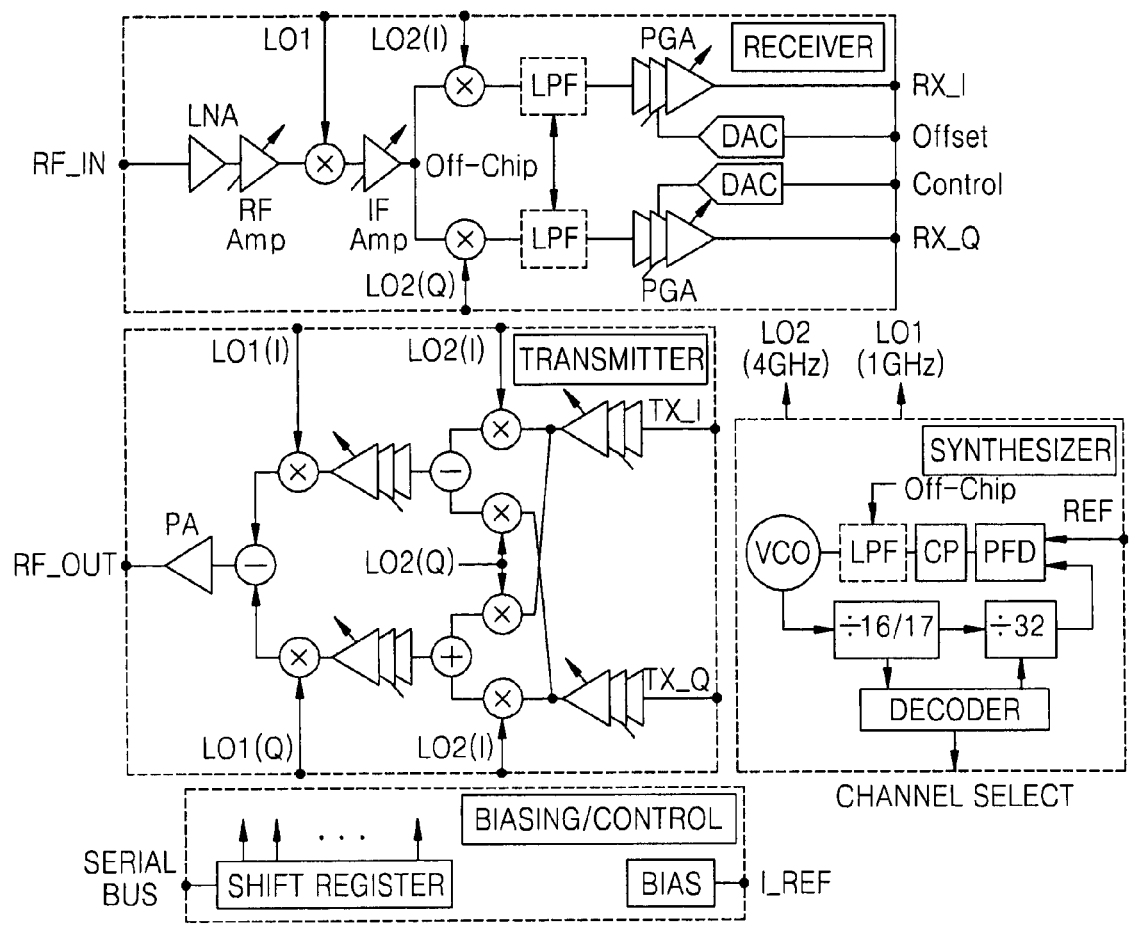
Figure 2:
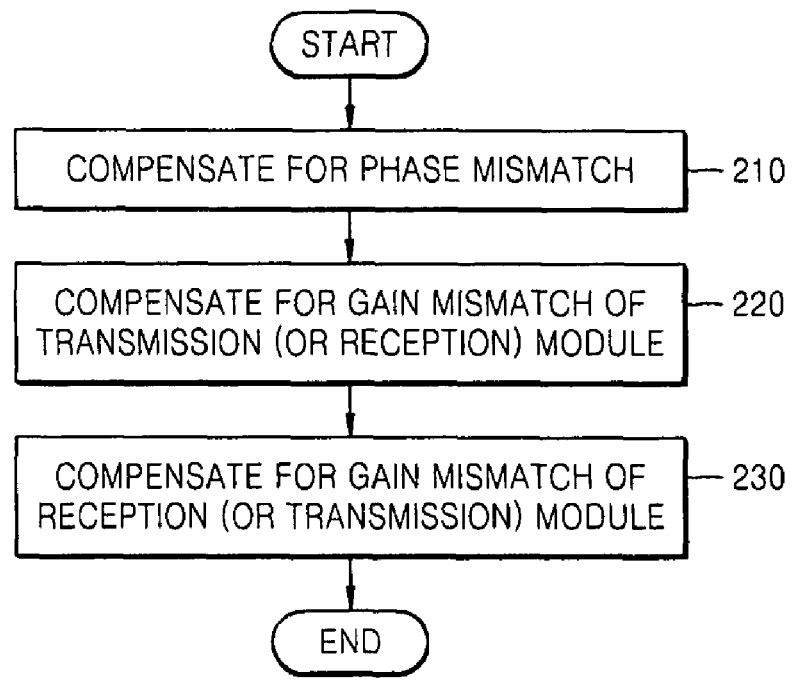
FIG. 2 is a flowchart of a method of compensating for a mismatch occurring in an RF quadrature transceiver, according to an exemplary embodiment of the present invention.

FIG. 2 is a flowchart of a method of compensating for a mismatch occurring in a radio frequency (RF) quadrature transceiver, according to an exemplary embodiment of the present invention. Referring to FIG. 2, in operation 210, compensation for a phase mismatch is performed. During operation 210, an artificially generated gain mismatch is used. This artificially generated gain mismatch will be described in greater detail later with reference to FIG. 5.

After the phase mismatch is compensated for in operation 210, a gain mismatch of a transmission (or reception) module is compensated for in operation 220, and a gain mismatch of the reception (or transmission) module is compensated for in operation 230. In other words, it does not matter which one of the gain mismatches of the transmission and reception modules is first compensated for. Rather, after the compensation of the gain mismatch of one of the transmission and reception modules is completed, the compensation of the gain mismatch of the other module is performed. This will be described in greater detail later with reference to FIG. 7.

Figure 3:
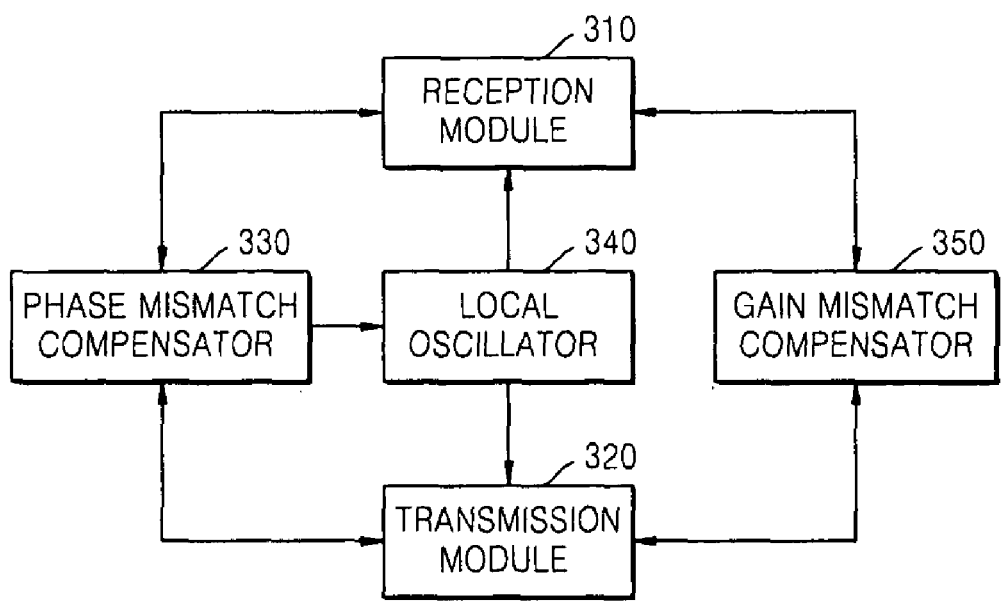
FIG. 3 is a block diagram of an RF quadrature transceiver according to an exemplary embodiment of the present invention.

FIG. 3 is a block diagram of an RF quadrature transceiver according to an exemplary embodiment of the present invention. As illustrated in FIG. 3, the RF quadrature transceiver according to an exemplary embodiment of the present invention includes a reception module 310, a transmission module 320, a phase mismatch compensator 330, a local oscillator 340, and a gain mismatch compensator 350.

The reception module 310 converts an RF signal into a baseband signal, whereas the transmission module 320 converts a baseband signal into an RF signal. The reception module 310 and the transmission module 320 can independently control the amplification gains of a baseband in-phase signal and a baseband quadrature signal according to a gain control signal.

The local oscillator 340 generates an RF carrier signal. More specifically, the local oscillator 340 generates an RF signal with a frequency, which may be predetermined, and adjusts the frequency of the RF signal using a frequency divider (not shown) to thereby generate the RF carrier signal. This will be described in greater detail later with reference to FIGS. 9A through 9C.

The phase mismatch compensator 330 performs phase mismatch compensation by controlling the local oscillator 340. The gain mismatch compensator 350 performs gain mismatch compensation by controlling the reception module 310 and the transmission module 320. In order to detect a mismatch, the phase mismatch compensator 330 and the gain mismatch compensator 350 establish a feedback path that allows the reception module 310 to directly receive a signal transmitted by the transmission module 320. To obtain this feedback path, an RF output port of the transmission module 320 and an RF input port of the reception module 310 are short-circuited. This will be described in greater detail later.

Figure 4:
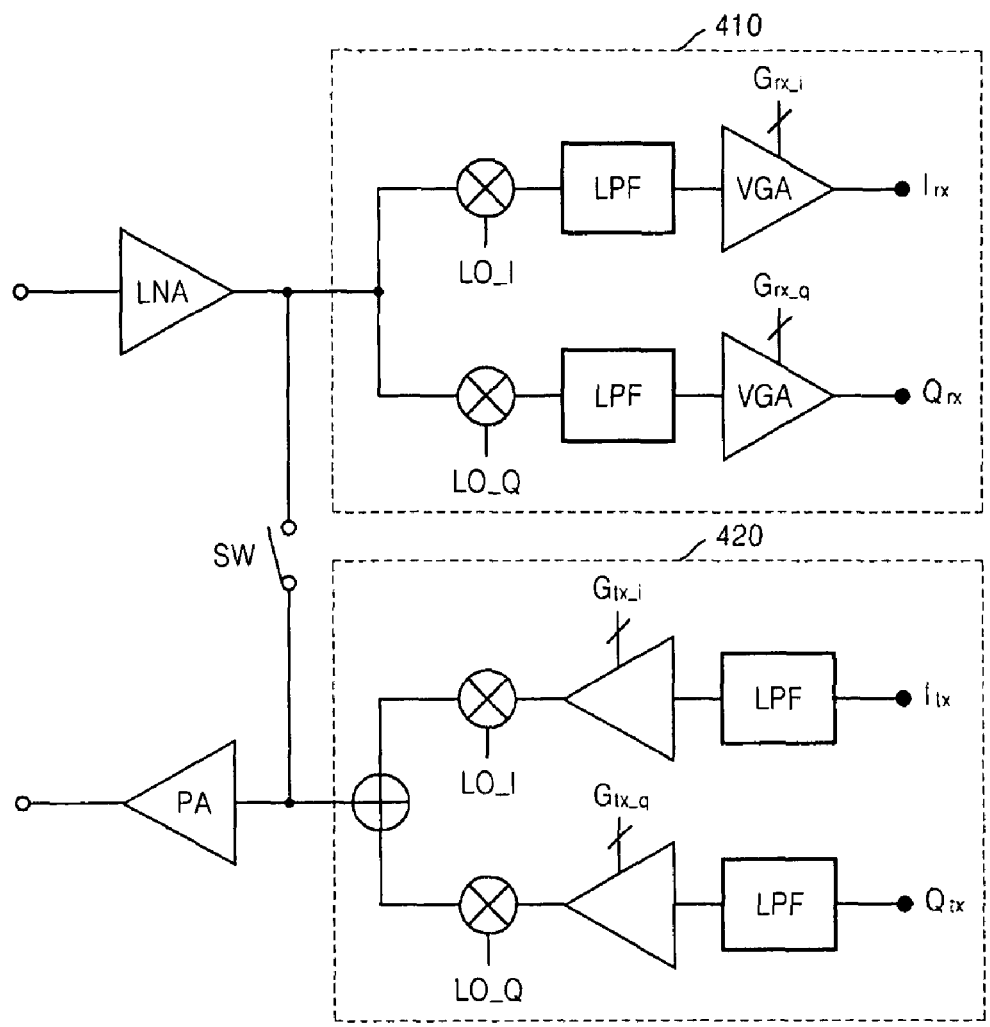
FIG. 4 is a schematic diagram of a structure of an RF quadrature transceiver according to an exemplary embodiment of the present invention.

FIG. 4 is a schematic diagram of a structure of an RF quadrature transceiver according to an exemplary embodiment of the present invention. Referring to FIG. 4, the RF quadrature transceiver according to an exemplary embodiment of the present invention is illustrated including a reception module 410 and a transmission module 420. Although a phase mismatch compensator and a gain mismatch compensator are not illustrated, it will be understood by one of ordinary skill in the art that the RF quadrature transceiver of FIG. 4 may be implemented in various forms according to the following description.

First, in an operation of the transmission module 420, baseband signals $I_{tx}$ and $Q_{tx}$ pass through low pass filters (LPFs) in order to remove noise in other bands from the baseband signals $I_{tx}$ and $Q_{tx}$. The baseband signals $I_{tx}$ and $Q_{tx}$, from which the noise has been removed, are amplified by amplifiers and modulated by mixers using carrier signals LO_I and LO_Q, respectively, so as to be converted into RF signals. The reception module 410 performs a process opposite to the process performed in the transmission module 420. In other words, in the reception module 410, received RF signals are demodulated by mixers so as to be converted into baseband signals, and the baseband signals pass through LPFs and are then amplified by variable gain amplifiers (VGAs).

In the RF quadrature transceiver illustrated in FIG. 4, amplification gains of the variable gain amplifiers that are respectively used on the paths of a baseband in-phase signal and a baseband quadrature signal can be controlled independently in each of the transmission and reception modules 420 and 410, and a phase mismatch and a gain mismatch are compensated for by using the amplification gains. This will now be described in greater detail.

Figure 5:
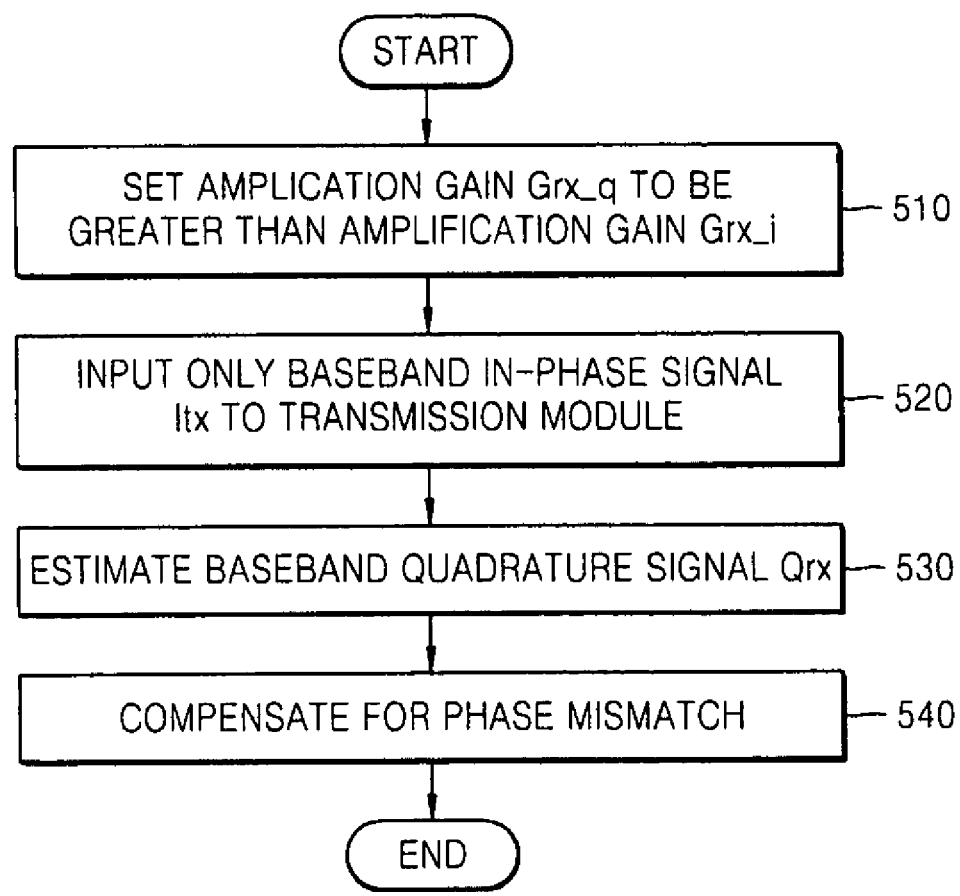
FIG. 5 is a flowchart of a phase mismatch compensating method performed in the RF quadrature transceiver of FIG. 4, according to an exemplary embodiment of the present invention.

FIG. 5 is a flowchart of a phase mismatch compensating method performed in the RF quadrature transceiver of FIG. 4, according to an exemplary embodiment of the present invention. Referring to FIGS. 4 and 5, in operation 510, control signals for the variable amplifiers of the reception module 410 are set so as to be different, and an amplification gain $G_{rx\_q}$ for a baseband quadrature signal $Q_{rx}$ is set so as to be much larger than an amplification gain $G_{rx\_i}$ for a baseband in-phase signal $I_{rx}$.

In operation 520, a switch SW for short-circuiting the RF output port of the transmission module 420 and the RF input port of the reception module 410 is closed so that the RF signals output from the transmission module 420 are input to the reception module 410, and the transmission module 420 only receives a baseband in-phase signal $I_{tx}$. In other words, the transmission module 420 does not receive a baseband quadrature signal $Q_{tx}$.

In operation 530, the reception module 410 estimates the baseband quadrature signal $Q_{rx}$ from the baseband in-phase signal $I_{tx}$ received in operation 520. In operation 540, the phase mismatch is compensated for on the basis of the estimated amplitude of the baseband quadrature signal $Q_{rx}$. In this exemplary embodiment, the baseband quadrature signal $Q_{rx}$ estimated in the reception module 410 is an amplification of noise generated only due to a phase mismatch, such that even a very small phase mismatch can be easily detected and compensated for, and the resolution of phase mismatch compensation can be increased. This will now be described in greater detail with reference to the following equations.

First, when the carrier signal LO_I for the in-phase signal is sin ωt, the following equation is established:

$$I_{rx} = a \cdot I_{tx} \cdot \sin^2 \omega t = a \cdot I_{tx} \cdot \frac{1 - \cos 2\omega t}{2}.$$

where a denotes a constant. However, an RF component is removed from the carrier signal LO_I by a corresponding LPF of the reception module 410, so that an equation, $I_{rx} = b I_{tx}$, is established (where b denotes a constant).

Since the carrier signal LO_I is given as sin ωt, ideally the carrier signal LO_Q for the quadrature signal is given as cos ωt. However, when the carrier signal LO_Q is given as cos (ωt+θ), the following equation is established:

$$Q_{rx} = c \cdot I_{tx} \cdot \sin \omega t \cdot \cos(\omega t + \theta)$$
$$= d \cdot I_{tx} \cdot [\sin(2\omega t + \theta) + \sin \theta]$$

where c and d denote constants. However, an RF component is removed from the carrier signal LO_Q by a corresponding LPF of the reception module 410, so that an equation, $Q_{rx} = \theta \cdot \sin \theta$, is established (where e denotes a constant). In other words, the baseband quadrature signal $Q_{rx}$ corresponds to noise generated due to a phase mismatch θ. Since the control signal $G_{rx\_q}$ is set to be larger than $G_{rx\_i}$ in operation 510, even if the phase mismatch θ is very small, the phase mismatch θ is easily detected and compensated for because the phase mismatch θ undergoes amplification. This effect is illustrated in FIGS. 6A and 6B.

Figure 6A:
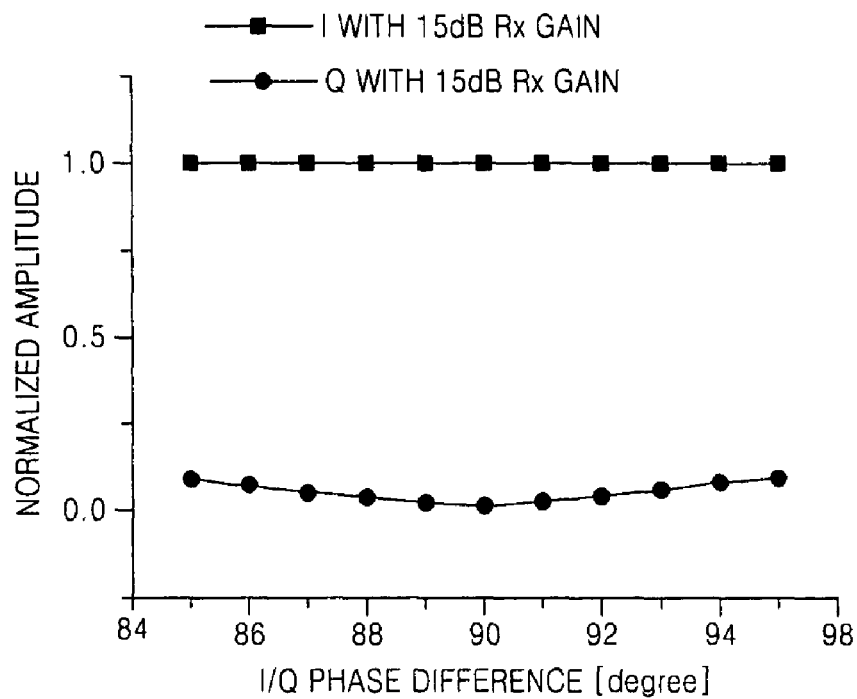
FIGS. 6A and 6B are graphs illustrating an efficiency comparison between the phase mismatch compensating method of FIG. 5 and a related art phase mismatch compensating method.
Figure 6B:
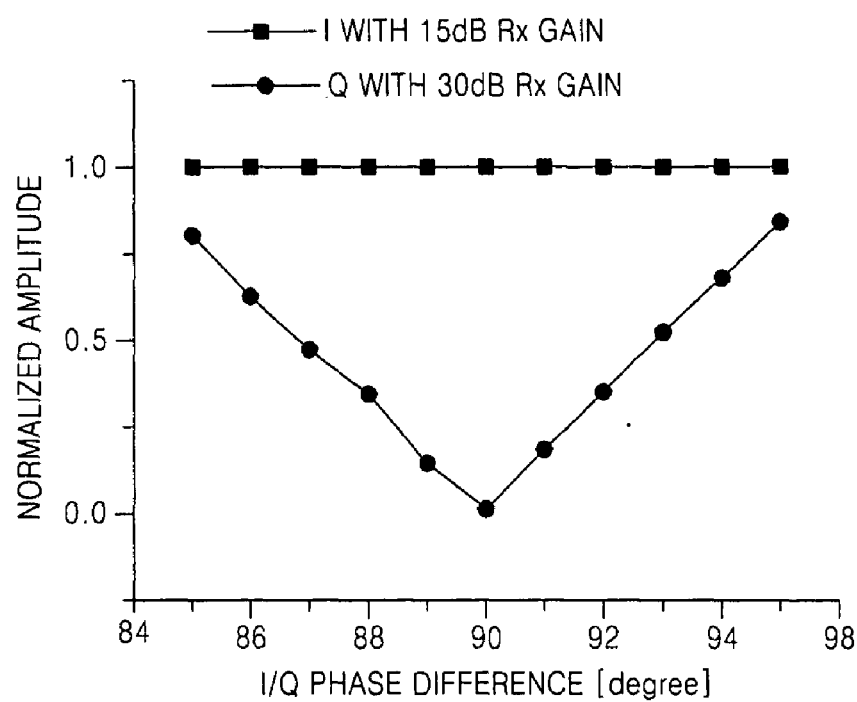

FIGS. 6A and 6B are graphs illustrating an efficiency comparison between the method of FIG. 5 and a related art phase mismatch compensating method.

The graphs of FIGS. 6A and 6B illustrate the amplitudes of baseband signals estimated in reception modules when transmission modules only receive baseband in-phase signals as in the exemplary embodiment of FIG. 5. FIG. 6A corresponds to a related art case where $G_{rx\_q}$ is set to be equal to $G_{rx\_i}$, and FIG. 6B corresponds to a case according to an exemplary embodiment of the present invention where $G_{rx\_q}$ is set to be greater than $G_{rx\_i}$. In other words, quadrature signals shown in FIGS. 6A and 6B correspond to noise generated due to phase mismatch.

As illustrated in FIG. 6A, when $G_{rx\_q}$ is set to be equal to $G_{rx\_i}$, a variation of the amplitude of the qudarature signal is subtle, such that detection and compensation of the phase mismatch are very difficult. However, in FIG. 6B, since $G_{rx\_q}$ is set to be greater than $G_{rx\_i}$, a variation of the amplitude of the quadrature signal is much more pronounced, such that even a very small phase mismatch can be easily detected and compensated for, leading to an increase in the resolution of phase mismatch compensation.

Figure 7:
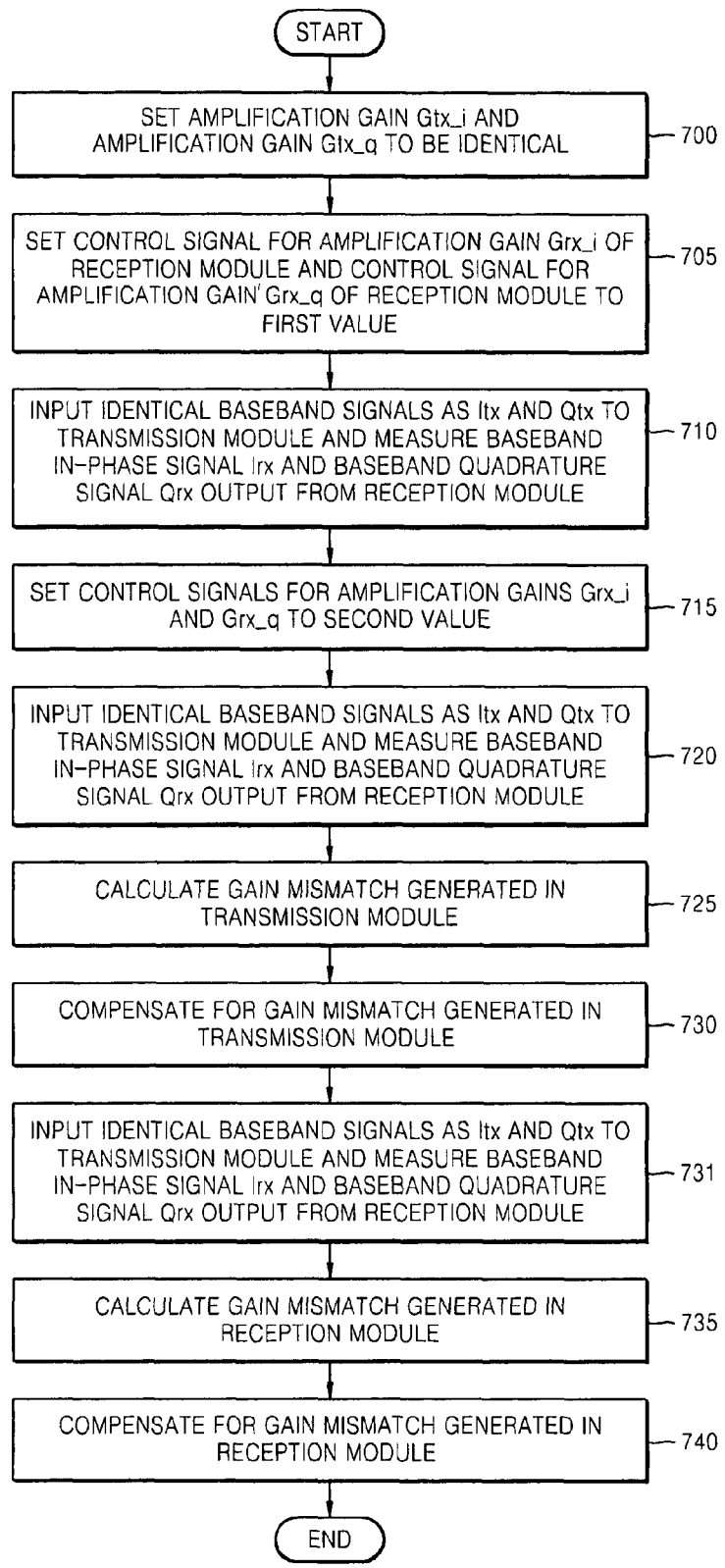
FIG. 7 is a flowchart of a gain mismatch compensating method performed in the RF quadrature transceiver of FIG. 4, according to an exemplary embodiment of the present invention.

FIG. 7 is a flowchart of a gain mismatch compensating method performed in the RF quadrature transceiver of FIG. 4, according to an exemplary embodiment of the present invention. The compensation of the gain mismatch according to an exemplary embodiment of the present invention may be performed after the compensation of the phase mismatch illustrated in FIG. 5 is completed. In other words, the baseband in-phase signal $I_{tx}$ whose phase mismatch has been compensated for and which is input to the transmission module 420 does not affect the quadrature signal $Q_{rx}$ output from the reception module 410. Also, the quadrature signal $Q_{rx}$ output from the reception module 410 does not affect the baseband in-phase signal $I_{tx}$ whose phase mismatch has been compensated for and which is input to the transmission module 420.

When control signals for the amplification gains of one module are identically fixed at a value, which may be predetermined, and control signals for the amplification gains of the other module are changed, a gain mismatch compensator (not shown) of the RF quadrature transceiver of FIG. 4 calculates a gain mismatch using the fact that, although a gain of an in-phase signal path and a gain of a quadrature signal path may be different at a specific value of a control signal, that is, a gain mismatch may occur, variation rates of the gains of the in-phase signal path and quadrature signal path according to a change of the control signal are identical.

In operation 700, a control signal for the amplification gain $G_{tx\_i}$ for the baseband in-phase signal $I_{tx}$ of the transmission module 420 and a control signal for the amplification gain $G_{tx\_q}$ for the baseband quadrature signal $Q_{tx}$ of the transmission module 420 are set to be the same.

In operation 705, a control signal for the amplification gain $G_{rx\_i}$ of the baseband in-phase signal $I_{rx}$ of the reception module 410 and a control signal for the amplification gain $G_{rx\_q}$ of the baseband quadrature signal $Q_{rx}$ of the reception module 410 are each set to a first value.

In operation 710, identical baseband signals $I_{tx}$ and $Q_{tx}$ are input to two input ports of the transmission module 420, and the baseband in-phase signal $I_{rx}$ and the baseband quadrature signal $Q_{rx}$ for the input baseband signals, which are output from the reception module 410, are measured.

In operation 715, the control signal for the amplification gains $G_{rx\_i}$ of the baseband in-phase signal $I_{rx}$ of the reception module 410 and the control signal for the amplification gain $G_{rx\_q}$ of the baseband quadrature signal $Q_{rx}$ of the reception module 410 are each set to a second value.

In operation 720, the same baseband signals as the input signals used in operation 710 are input to the two input ports of the transmission module 420, and the baseband in-phase signal $I_{rx}$ and the baseband quadrature signal $Q_{rx}$ for the input baseband signals, which are output from the reception module 410, are further measured.

In operation 725, a gain mismatch between the baseband in-phase signal and the baseband quadrature signal generated in the transmission module 420 is calculated using the measured values of the baseband in-phase signal and baseband quadrature signal output from the reception module 410. In operation 730, the gain mismatch is compensated for on a basis of a result of the calculation performed in operation 730. The calculation of the gain mismatch will now be described in greater detail.

The baseband in-phase signal and baseband quadrature signal output from the reception module 410 may be expressed as follows:

$$I_{rx} = I_{tx} \cdot G_{tx\_i} \cdot G_{rx\_i}$$

$$Q_{rx} = Q_{tx} \cdot G_{tx\_q} \cdot G_{rx\_q}$$

When the first value of the control signal is a, the amplitudes of the signals measured in operation 710 may be calculated using the following equations:

$$I_{rx}(a) = I_{tx} \cdot G_{tx\_i} \cdot G_{rx\_i}(a)$$

$$Q_{rx}(a) = Q_{tx} \cdot G_{tx\_q} \cdot G_{rx\_q}(a)$$

When the second value of the control signal is b, the amplitudes of the signals measured in operation 720 may be calculated using the following equations:

$$I_{rx}(b) = I_{tx} \cdot G_{tx\_i} \cdot G_{rx\_i}(b)$$

$$Q_{rx}(b) = Q_{tx} \cdot G_{tx\_q} \cdot G_{rx\_q}(b)$$

A subtraction of the latter equations from the former equations results in the following equations:

$$I_{rx}(a) - I_{rx}(b) = I_{tx} \cdot G_{tx\_i} \cdot [G_{rx\_i}(a) - G_{rx\_i}(b)]$$

$$Q_{rx}(a) - Q_{rx}(b) = Q_{tx} \cdot G_{tx\_q} \cdot [G_{rx\_q}(a) - G_{rx\_q}(b)]$$

Since the baseband signals $I_{tx}$ and $Q_{tx}$ are identical and the variation rates of the gains of an in-phase signal path and quadrature signal path with respect to a change of a control signal are the same as described above, once $I_{rx}(a)$, $I_{rx}(b)$, $Q_{rx}(a)$, and $Q_{rx}(b)$ are measured, the following equation can be obtained:

$$G_{tx\_i} = k G_{tx\_q}$$

wherein k denotes a constant. Since the control signal for the amplification gain $G_{tx\_i}$ for the baseband in-phase signal $I_{tx}$ of the transmission module 420 and the control signal for the amplification gain $G_{tx\_q}$ for the baseband quadrature signal $Q_{tx}$ of the transmission module 420 have been set to be the same in operation 700, if k is not 1, then a gain mismatch has been generated.

Therefore, in operation 730, the gain mismatch generated in the transmission module 420 is compensated for by suitably adjusting the gain control signals of the variable amplifiers of the transmission module 420 on the basis of the value k.

After operation 730 is completed, the phase mismatch, and the gain mismatch of the transmission module 420 have been compensated for, and thus a gain mismatch of the reception module 410 can be simply compensated for in operations 731, 735, and 740. In other words, after adjusted gain control signals of the amplifiers of the transmission module 420 are equally set and arbitrary gain control signals for the amplifiers of the reception module 410 are equally set, identical baseband signals are input to the two input ports of the transmission module 420 in operation 731. In this exemplary embodiment, the same baseband signals as the signals input in operations 710 and 720 are input in operation 731. However, arbitrary signals may be input in operation 731 as long as identical baseband signals are input to the two input ports of the transmission module 420.

When the baseband signals have been input to the transmission module 420, the amplitudes of the baseband in-phase signal and baseband quadrature signal output from the reception module 410 are compared. In operation 735, the gain control signals for the amplifiers of the reception module 410 are adequately controlled according to a result of the comparison.

In exemplary embodiments of the present invention, the gain mismatch of the transmission module 420 is first compensated, and the gain mismatch of the reception module 410 is thereafter compensated. However, the order of compensations may be switched. That is, the gain mismatch of the reception module 410 may be compensated for first, and then the gain mismatch of the transmission module 420 may be compensated.

FIGS. 8A through 8C are graphs illustrating an algorithm for estimating a value of a gain mismatch, according to an exemplary embodiment of the present invention. FIG. 8A illustrates a gain of an in-phase signal path and a gain of a quadrature signal path versus a change of a gain control signal applied to a variable gain amplifier. In other words, as illustrated in FIG. 8A, the gains of the two paths may be different at a specific value of the gain control signal, but the variation rates of the gains, that is, the slopes of the straight lines representing the gain variations, are the same.

FIGS. 8B and 8C are graphs showing the amplitudes of the baseband signals $I_{rx}$ and $Q_{rx}$, respectively, output from the reception module 410, according to variations of the gain control signals. As illustrated in FIGS. 8A and 8B, the two graphs have different slopes. However, the value of the gain mismatch can be obtained using the characteristic that the slopes of the graphs illustrating the gain variations are the same.

In other words, in order to obtain the value of a gain mismatch from the following equations:

$$I_{rx}(a) - I_{rx}(b) = I_{tx} \cdot G_{tx\_i} \cdot [G_{rx\_i}(a) - G_{rx\_i}(b)]$$

$$Q_{rx}(a) - Q_{rx}(b) = Q_{tx} \cdot G_{tx\_q} \cdot [G_{rx\_q}(a) - G_{rx\_q}(b)]$$

the following equation can be used:

$$[G_{rx\_i}(a) - G_{rx\_i}(b)] = [G_{rx\_q}(a) - G_{rx\_q}(b)]$$

Figure 9B:
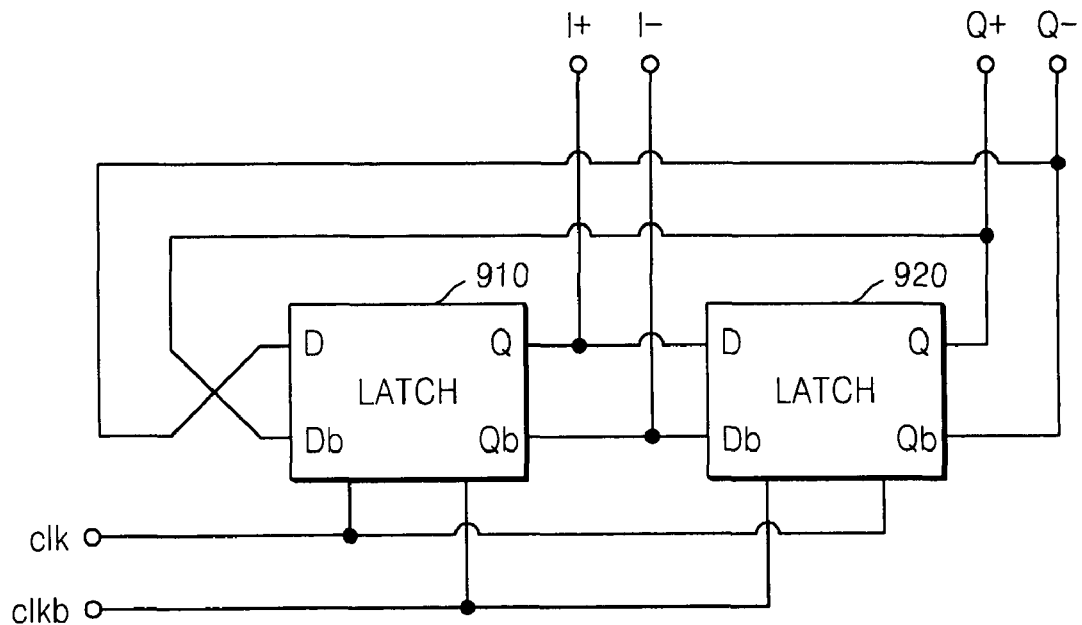
Figure 9C:
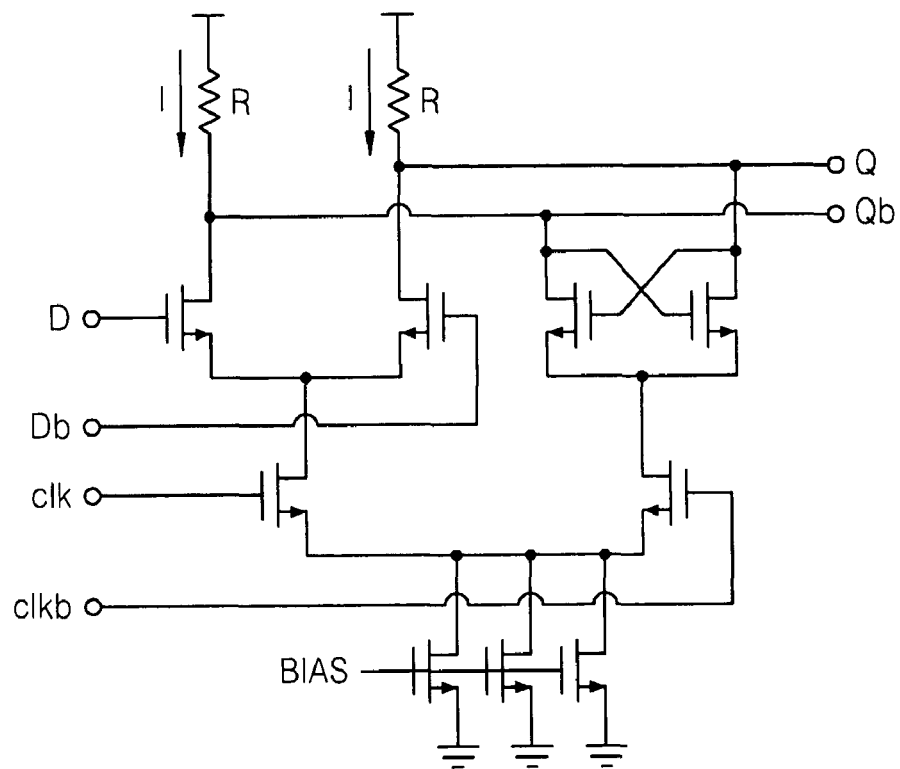

FIGS. 9A through 9C are schematic diagrams of an apparatus for compensating for a phase mismatch, according to an exemplary embodiment of the present invention. As illustrated in FIG. 9A, an oscillator VCO generates an RF signal, and a frequency divider 900 generates carrier signals having frequencies corresponding a fraction of the RF signal. For example, the frequency divider 900 may generate carrier signals having frequencies corresponding to ½ the frequency of the RF signal. FIG. 9B illustrates the frequency divider 900, which includes cross-coupled latches 910, 920.

FIG. 9C is a circuit diagram of one of the latches illustrated in FIG. 9B. As illustrated in FIG. 9C, a phase mismatch compensator according to an exemplary embodiment of the present invention controls the difference between the phases of the two carrier signals output from the frequency divider 900, by independently adjusting the main currents of the two latches using a bias.

Figure 10A:
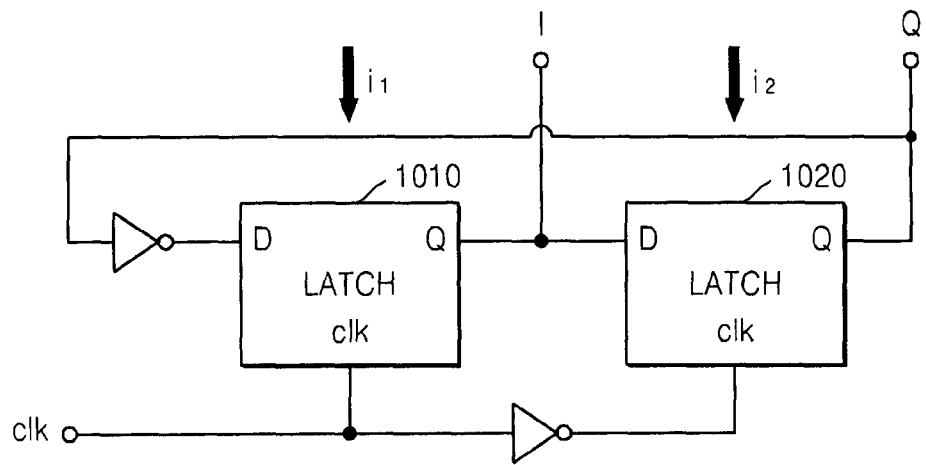
FIGS. 10A and 10B are a circuit diagram and a waveform diagram for explaining a method of compensating for a phase mismatch, according to an exemplary embodiment of the present invention.
Figure 10B:
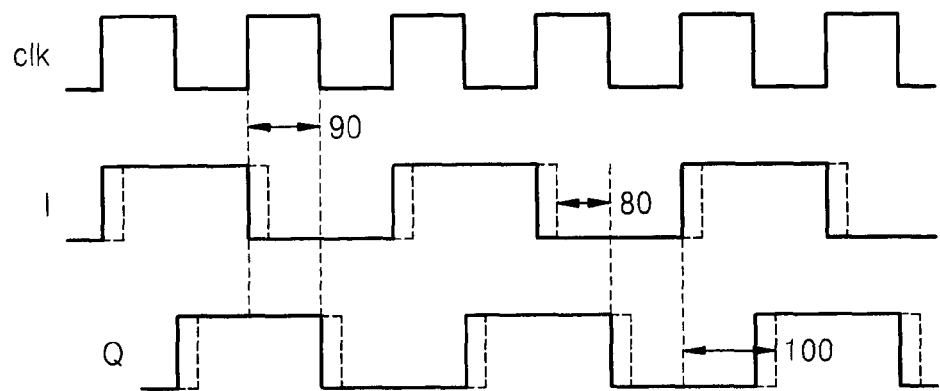

FIGS. 10A and 10B are a circuit diagram and a waveform diagram for explaining a method of compensating for a phase mismatch, according to another exemplary embodiment of the present invention. As illustrated in FIG. 10A, an I signal and a Q signal output from two cross-coupled latches 1010, 1020 correspond to carrier signals having frequencies corresponding to, for example, ½ a clock frequency. As described above, the phase mismatch compensator according to an exemplary embodiment of the present invention controls the difference between the phases of the two carrier signals by adjusting independently the main currents of the two latches. Hence, as illustrated in FIG. 10B, the phase mismatch can be compensated for by independently controlling the phases of the I and Q signals.

In an RF quadrature transceiver using a direct-conversion scheme according to exemplary embodiments of the present invention, a phase mismatch and a gain mismatch generated therein are accurately compensated for without depending on a special external circuit or a complicated algorithm. Therefore, the RF quadrature transceiver according to exemplary embodiments of the present invention provide improved performance.

Exemplary embodiments of the present invention can be implemented in digital signal processing (DSP) modules or microcomputers by converting the baseband signals input to the input ports of the transmission module and/or the baseband signals output from the output ports of the reception module into digital signals. Hence, exemplary embodiments of the present invention can be written as programs that can be executed in the DSP modules or microcomputers.

Accordingly, exemplary embodiments of the present invention can be implemented in computers that execute the programs using a computer readable recording medium. Examples of the computer readable recording medium include magnetic storage media (e.g., ROM, floppy disks, hard disks, etc.), optical recording media (e.g., CD-ROMs, or DVDs), and storage media such as carrier waves (e.g., transmission through the Internet).

While the present inventive concept has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A signal processing method performed in a radio frequency quadrature transceiver including a reception module and a transmission module, the signal processing method comprising:
    setting an amplification gain for a baseband quadrature signal to be larger than an amplification gain for a baseband in-phase signal in the reception module;
    applying only the baseband in-phase signal to the transmission module while an output port of the transmission module and an input port of the reception module are short-circuited;
    detecting a phase mismatch between carrier signals used for modulation and demodulation based on a signal output from a quadrature output port of the reception module in response to the applied baseband in-phase signal; and
    performing a compensation for the detected phase mismatch.

2. The signal processing method of claim 1, further comprising:
    setting amplification gains for a plurality of baseband signals of a first module, the first module being one of the reception module and the transmission module, to be the same;
    setting amplification gains for a plurality of baseband signals of a second module, the second module being the other one of the reception module and the transmission module, to a first value;
    inputting identical signals to an in-phase input port and a quadrature input port of the transmission module;
    measuring amplitudes of baseband signals output from the reception module;
    setting the amplification gains for the plurality of baseband signals of the second module to a second value;
    re-inputting the identical signals to the in-phase input port and the quadrature input port of the transmission module;
    measuring amplitudes of baseband signals output from the reception module;
    calculating a gain mismatch between an in-phase path and a quadrature path of the first module on the basis of the amplitudes measured for the first value and the second value; and
    compensating for a gain mismatch of the first module on a basis of a result of calculating the gain mismatch.

3. The signal processing method of claim 2, further comprising:
    inputting identical signals to the in-phase input port and the quadrature input port of the transmission module;
    comparing the amplitudes of baseband signals output from the reception module; and
    compensating for a gain mismatch of the second module according to a result of comparing the amplitudes.

4. The signal processing method of claim 1, wherein:
    a carrier signal used in the transmission module and a carrier signal used in the reception module are generated by a frequency divider comprising two cross-coupled latches; and
    the compensating for the phase mismatch comprises controlling a phase difference between the carrier signal used in the transmission module and the carrier signal used in the reception module by independently controlling main currents of the two cross-coupled latches of the frequency divider.

5. A radio frequency quadrature transceiver comprising:
    a phase mismatch compensator which sets an amplification gain for a baseband quadrature signal to be larger than an amplification gain for a baseband in-phase signal in a reception module, applies only the baseband in-phase signal to a transmission module while an output port of the transmission module and an input port of the reception module are short-circuited, detects a phase mismatch between carrier signals used for modulation and demodulation based on a signal output from a quadrature output port of the reception module in response to the applied baseband in-phase signal, and compensates for the detected phase mismatch.

6. The radio frequency quadrature transceiver of claim 5, further comprising:
    a gain mismatch compensator which sets amplification gains for a plurality of baseband signals of a first module, the first module being one of the reception module and the transmission module, to be the same, and sets amplification gains for a plurality of baseband signals of a second module, the second module being the other one of the reception module and the transmission module, to a first value;

inputs identical signals to an in-phase input port and a quadrature input port of the transmission module;

measures amplitudes of baseband signals output from the reception module;

sets amplification gains for the baseband signals of the second module to a second value;

re-inputs the identical signals to the in-phase input port and the quadrature input port of the transmission module;

measures the amplitudes of baseband signals output from the reception module;

calculates a gain mismatch between an in-phase path and a quadrature path of the first module on a basis of the amplitudes measured for the first value and the second value; and compensates for a gain mismatch of the first module on a basis of a result of calculating the gain mismatch.

7. The radio frequency quadrature transceiver of claim 6, wherein after compensating for the gain mismatch of the first module, the gain mismatch compensator inputs identical signals to the in-phase input port and the quadrature input port of the transmission module, compares amplitudes of baseband signals output from the reception module, and compensates for a gain mismatch of the second module according to a result of the comparison.

8. The radio frequency quadrature transceiver of claim 5, further comprising:

a frequency divider which generates a carrier signal used in the transmission module and a carrier signal used in the reception module by dividing a frequency of a signal using two cross-coupled latches, wherein the phase mismatch compensator controls a phase difference between the carrier signal used in the transmission module and the carrier signal used in the reception module by independently controlling main currents of the two cross-coupled latches of the frequency divider.

9. A computer readable recording medium having recorded thereon a computer program for executing the method of claim 1.

* * * * *